United States Patent
Sasaki et al.

(10) Patent No.: US 11,135,623 B2
(45) Date of Patent: Oct. 5, 2021

(54) WAFER TRANSPORT CONTAINER INTERIOR ATMOSPHERE MEASUREMENT DEVICE, WAFER TRANSPORT CONTAINER, WAFER TRANSPORT CONTAINER INTERIOR CLEANING DEVICE, AND WAFER TRANSPORT CONTAINER INTERIOR CLEANING METHOD

(71) Applicant: TDK CORPORATION, Tokyo (JP)

(72) Inventors: Mutsuo Sasaki, Tokyo (JP); Tatsuhiro Kotsugai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 84 days.

(21) Appl. No.: 15/836,132

(22) Filed: Dec. 8, 2017

(65) Prior Publication Data
US 2018/0161830 A1    Jun. 14, 2018

(30) Foreign Application Priority Data
Dec. 13, 2016  (JP) .............................. JP2016-241489

(51) Int. Cl.
| | |
|---|---|
| *B65D 85/30* | (2006.01) |
| *B08B 5/00* | (2006.01) |
| *H01L 21/68* | (2006.01) |
| *H01L 21/673* | (2006.01) |
| *H01L 21/304* | (2006.01) |
| *H01L 21/67* | (2006.01) |
| *H01L 21/677* | (2006.01) |

(52) U.S. Cl.
CPC ................ *B08B 5/00* (2013.01); *B65D 85/30* (2013.01); *H01L 21/304* (2013.01); *H01L 21/6734* (2013.01); *H01L 21/67253* (2013.01); *H01L 21/67294* (2013.01); *H01L 21/67393* (2013.01); *H01L 21/67775* (2013.01); *H01L 21/68* (2013.01)

(58) Field of Classification Search
USPC .................................................. 206/710, 711
See application file for complete search history.

(56) References Cited

U.S. PATENT DOCUMENTS

| | | | |
|---|---|---|---|
| 6,901,971 B2 * | 6/2005 | Speasl .................. | G03F 7/7075 141/1 |
| 2002/0124906 A1 | 9/2002 | Suzuki et al. | |
| 2003/0115956 A1 | 6/2003 | Moehnke et al. | |
| 2003/0115978 A1 | 6/2003 | Moehnke et al. | |
| (Continued) | | | |

FOREIGN PATENT DOCUMENTS

| | | |
|---|---|---|
| CN | 101140635 A | 3/2008 |
| JP | 2002-261159 A | 9/2002 |
| (Continued) | | |

*Primary Examiner* — Jacob K Ackun
(74) *Attorney, Agent, or Firm* — Oliff PLC (57) ABSTRACT

A wafer transport container interior atmosphere measurement device is arranged in wafer transport container. The device detects an atmosphere in the wafer transport container and communicates the atmosphere. The device includes a detector, a transmitter, and a power source. The detector detects the atmosphere in the wafer transport container. The transmitter wirelessly transmits a first information including a detection result by the detector to an external receiver. The power source supplies electric power to the detector and the transmitter.

7 Claims, 11 Drawing Sheets

(56) References Cited

U.S. PATENT DOCUMENTS

| | | | |
|---|---|---|---|
| 2004/0187451 A1 | 9/2004 | Suzuki et al. | |
| 2004/0267501 A1 | 12/2004 | Freed et al. | |
| 2005/0284535 A1* | 12/2005 | Speasl | G03F 7/7075 141/1 |
| 2006/0181242 A1 | 8/2006 | Freed et al. | |
| 2008/0062066 A1 | 3/2008 | Arai | |
| 2011/0220545 A1 | 9/2011 | Ra et al. | |
| 2012/0083918 A1* | 4/2012 | Yamazaki | H01L 21/67389 700/112 |
| 2013/0000254 A1 | 1/2013 | Rebstock | |
| 2013/0000676 A1 | 1/2013 | Rebstock | |
| 2013/0004268 A1 | 1/2013 | Rebstock | |
| 2013/0004270 A1 | 1/2013 | Rebstock | |
| 2013/0174640 A1* | 7/2013 | Oh | H01L 21/67389 73/23.2 |
| 2017/0162413 A1 | 6/2017 | Rebstock | |
| 2019/0139803 A1 | 5/2019 | Rebstock | |

FOREIGN PATENT DOCUMENTS

| | | |
|---|---|---|
| JP | 2003-347397 A | 12/2003 |
| JP | 2005-202933 A | 7/2005 |
| JP | 2014-195230 A | 10/2014 |
| KR | 10-2004-0075896 A | 8/2004 |
| KR | 10-2011-0103830 A | 9/2011 |
| KR | 10-2014-0047099 A | 4/2014 |

\* cited by examiner

WAFER TRANSPORT CONTAINER INTERIOR ATMOSPHERE MEASUREMENT DEVICE, WAFER TRANSPORT CONTAINER, WAFER TRANSPORT CONTAINER INTERIOR CLEANING DEVICE, AND WAFER TRANSPORT CONTAINER INTERIOR CLEANING METHOD

BACKGROUND OF THE INVENTION

1. Field of the Invention

The present invention relates to a wafer transport container interior atmosphere measurement device or so that detects an atmosphere in a wafer transport container for transporting a wafer.

2. Description of the Related Art

For example, in a semiconductor manufacturing process, wafers are transported among processing devices using a transport container called a SMIF, a FOUP, or the like.

To protect a wafer surface from oxidation and contamination, an environment in a transport container housing wafers is preferably kept in an inactive state above a predetermined level and kept having cleanliness above a predetermined level. As a method for improving an inactive state and the cleanliness of gas in a transport container, a technique, such as gas purging, of introducing cleaning gas into the container or a space communicating with the container has been proposed. In addition, as a technique of cleaning the interior of a transport container to a predetermined level, a technique of connecting a pipe to the container, causing gas in the container to circulate between the container and an external environmental control unit, and controlling the concentration of water and the concentration of oxygen in the container has been proposed (see Patent Document 1).

Patent Document 1: JP 2003-347397 A

SUMMARY OF THE INVENTION

In a conventional method that performs control by leading gas in a container outside, however, cleanliness in the container cannot be detected unless gas in the container is once led outside. For this reason, a process of leading gas in the container outside is necessary for detection of cleanliness in a container regardless of whether the container is a container with sufficiently high cleanliness or a container with low cleanliness. Due to the disadvantage, streamlining of processing is desired. In addition, downsizing is difficult in a conventional technique that requires a pipe for leading gas in a container outside. Gas in a container may be mixed with different gas while being led outside. The conventional technique also suffers from a problem with detection accuracy.

The present invention has been achieved under such circumstances. It is an object of the invention to provide a wafer transport container interior atmosphere measurement device that is downsizable and detects an atmosphere in a wafer transport container with high accuracy and communicates the atmosphere.

To achieve the above object, the wafer transport container interior atmosphere measurement device according to the present invention is a wafer transport container interior atmosphere measurement device arranged in a wafer transport container and configured to detect an atmosphere in the wafer transport container and communicate the atmosphere, the device comprising:

a detector configured to detect the atmosphere in the wafer transport container;

a transmitter configured to wirelessly transmit a first information including a detection result by the detector to an external receiver; and a power source configured to supply electric power to the detector and the transmitter.

Since the wafer transport container interior atmosphere measurement device according to the present invention is arranged in the wafer transport container, the atmosphere in the wafer transport container can be detected even without leading gas in the wafer transport container to outside the wafer transport container. Since the wafer transport container interior atmosphere measurement device comprises the transmitter configured to wirelessly communicate the detection result, the receiver located away from the wafer transport container being transported in a factory can recognize the detection result of the atmosphere in the wafer transport container, and an appropriate processing, such as cleaning processing, can be carried out against the wafer transport container based on the detection result as needed. Since data is transmitted through wireless communication, an electrical contact for data transmission need not be provided on the surfaces of the wafer transport container interior atmosphere measurement device and the wafer transport container installing the wafer transport container interior atmosphere measurement device, and the airtightness and durability of the wafer transport container are little impaired.

For example, the power source may comprise:

a rechargeable electricity storage unit; and a power receiving unit configured to receive energy supply from an outside and charge the electricity storage unit.

When the power source comprises the electricity storage unit and the power receiving unit, the electricity storage unit is charged at appropriate timing, and the wafer transport container interior atmosphere measurement device can thereby continuously detect the atmosphere in the wafer transport container and communicate the detection result without battery replacement and the like. Thus, the above-mentioned wafer transport container interior atmosphere measurement device can save much trouble in battery life management and can reduce battery management and replacement costs.

For example, the power receiving unit may comprise a non-contact charging power receiving coil.

When the power receiving unit comprises the non-contact charging power receiving coil, the above-mentioned wafer transport container interior atmosphere measurement device can charge the electricity storage unit even without a wiring that is electrically conductive with the outside. For this reason, although a measurement device which is an electrical device is installed as the wafer transport container interior atmosphere measurement device, the wafer transport container interior atmosphere measurement device little impairs the airtightness and durability of the wafer transport container, where the wafer transport container interior atmosphere measurement device is installed.

For example, the transmitter may wirelessly transmit a second information different from the first information to the receiver when a voltage of the electricity storage unit becomes a predetermined value or more.

When the transmitter transmits the second information associated with the voltage of the electricity storage unit to the receiver, the receiver can recognize whether the wafer transport container interior atmosphere measurement device of interest is in a state capable of detecting the atmosphere in the wafer transport container and communicating the atmosphere. With this configuration, even if the voltage of the electricity storage unit becomes less than the predetermined value while the wafer transport container interior atmosphere measurement device is transported together with the wafer transport container, when the voltage recovers to the predetermined value or more by charging the electricity storage unit via the power receiving unit, the receiver recognizes the recovery by receiving the second information, and the wafer transport container interior atmosphere measurement device can be caused to detect the atmosphere in the wafer transport container and communicate the atmosphere at appropriate timing.

For example, the wafer transport container interior atmosphere measurement device according to the present invention may further comprise a cover portion configured to cover the detector excluding a sensing portion in contact with the atmosphere in the wafer transport container, the transmitter, and the power source so as to avoid contact with the atmosphere.

The wafer transport container interior atmosphere measurement device including the above-mentioned cover portion can protect circuits, electronic parts, and the like constituting the detector, the transmitter, and the power source from outgas of a wafer and has preferable reliability.

The wafer transport container according to the present invention may comprise:

any of the above-mentioned water transport container interior atmosphere measurement devices.

a housing portion accommodating a wafer and provided with a main opening for unloading and loading the wafer; and a lid detachably provided at the main opening, wherein a bottom opening capable of discharging gas from the wafer transport container is formed at a bottom portion of the housing portion, and the detector of the wafer transport container interior atmosphere measurement device is provided in a vicinity of the bottom opening.

In the above-mentioned wafer transport container, the detector can appropriately detect the atmosphere in the wafer transport container.

The wafer transport container interior cleaning device according to the present invention is a wafer transport container interior cleaning device for cleaning an interior of a wafer transport container, the device comprising:

a cleaning gas inlet configured to introduce a cleaning gas into the wafer transport container;

a receiver configured to receive a first information including a detection result of an atmosphere in the wafer transport container from a wafer transport container interior atmosphere measurement device arranged in the wafer transport container; and a controller configured to control the cleaning gas inlet based on the detection result received by the receiver.

In the wafer transport container interior cleaning device according to the present invention, the cleaning gas inlet is controlled based on the first information including the detection result by the wafer transport container interior atmosphere measurement device, and the cleaning processing can be thereby efficiently carried out in a short time. In addition, if cleanliness in the wafer transport container is sufficiently high, the cleaning processing can be omitted or simplified.

A wafer transport container interior cleaning method according to the present invention, comprising the steps of:

detecting an atmosphere in a wafer transport container by a wafer transport container interior atmosphere measurement device arranged in the wafer transport container;

wirelessly transmitting a first information including a detection result of the atmosphere by the wafer transport container interior atmosphere measurement device;

receiving the first information by a receiver of a wafer transport container interior cleaning device; and controlling a cleaning gas inlet of the wafer transport container interior cleaning device based on the detection result included in the first information received by the receiver and cleaning an interior of the wafer transport container by a controller of the wafer transport container interior cleaning device.

In the wafer transport container interior cleaning device according to the present invention, the cleaning gas inlet is controlled based on the first information including the detection result by the wafer transport container interior atmosphere measurement device, and the cleaning processing can be thereby efficiently carried out in a short time. In addition, if cleanliness in the wafer transport container is sufficiently high, the cleaning processing can be omitted or simplified.

DETAILED DESCRIPTION OF THE PREFERRED EMBODIMENT

The present invention is described below based on an embodiment shown in drawings.

Figure 1:
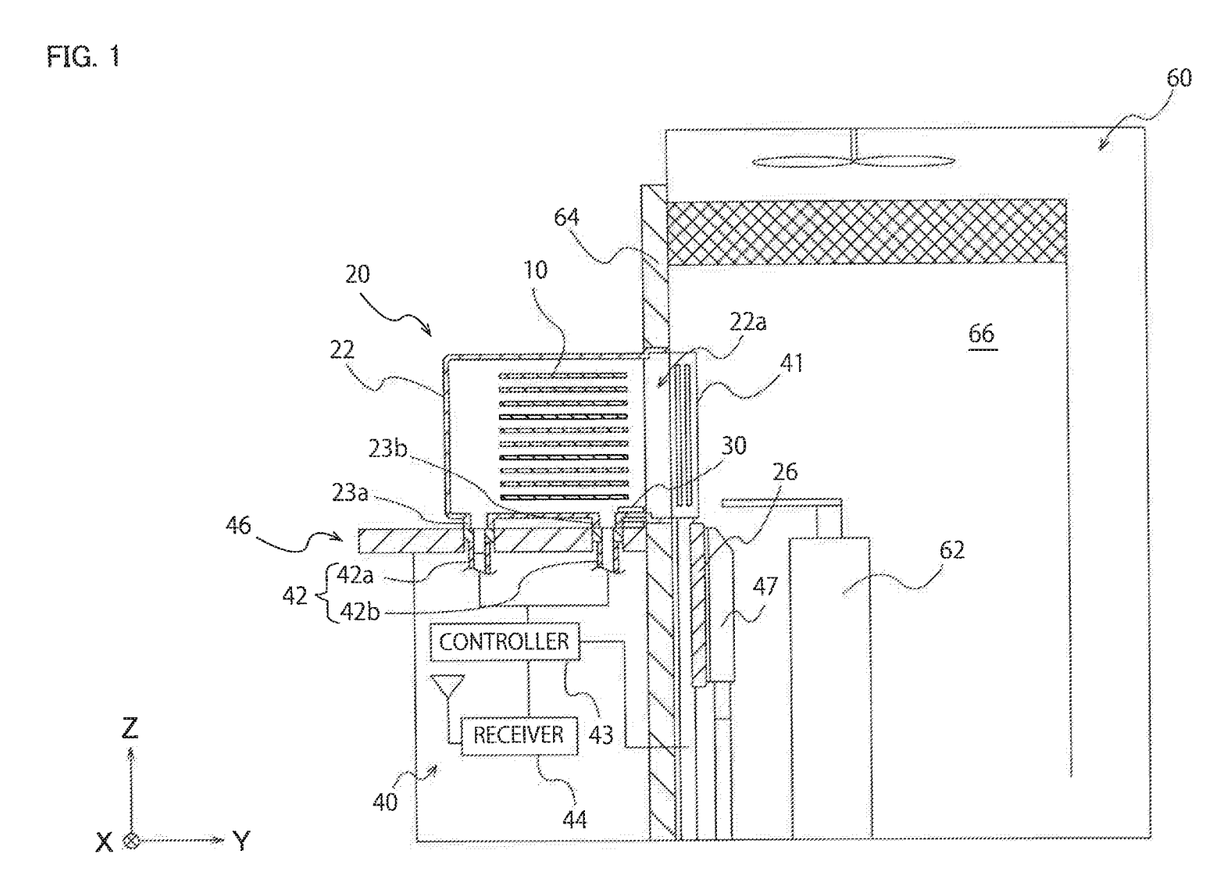
FIG. 1 is a schematic view of a wafer transport container and a wafer transport container interior cleaning device according to an embodiment of the present invention.

FIG. 1 is a schematic view representing a FOUP 20 as a wafer transport container and a load port device 40 as a wafer transport container interior cleaning device according to an embodiment of the present invention. The FOUP 20 includes a wafer transport container interior atmosphere measurement device 30 (hereinafter simply referred to as a measurement device 30). The load port device 40 cleans the FOUP 20.

The load port device 40 constitutes a part of an EFEM 60 for taking a wafer 10 out of the FOUP 20 and transporting the wafer 10 to a semiconductor processing device (not shown). The load port device 40 is installed on a wall portion 64 of a wafer transport chamber 66 formed in the EFEM 60 and functions as a part of an interface for moving the wafer 10 to a semiconductor treatment chamber. The interior of the wafer transport chamber 66 of the EFEM 60 is maintained in a fixed clean environment using a fan filter unit or the like. The wafer transport chamber 66 is provided with a transport robot 62 or so including a robot arm for taking the wafer 10 from the FOUP 20.

The load port device 40 includes an installation stand 46 on which the FOUP 20 is to be installed. The FOUP 20 for hermetically storing and transporting the wafers 10 can be detachably mounted on an upper portion of the installation stand 46 in the Z-axis direction. The installation stand 46 can move from a position shown in FIG. 5 to a position shown in FIG. 1 in the Y-axis direction while the FOUP 20 is mounted on the upper portion. Incidentally, in the drawings, the Y-axis is a movement direction of the installation stand 46, the Z-axis is a vertical direction, and the X-axis is a vertical direction to the Y-axis and the Z-axis.

The load port device 40 shown in FIG. 1 includes a door 47 for opening a lid 26 of the FOUP 20. The load port device 40 opens the lid 26 of the FOUP 20 using the door 47 after moving the FOUP 20 to a position where the FOUP 20 engages with an opening in the wall portion 64. With this operation, the interior of a housing portion 22 of the FOUP 20 and the wafer transport chamber 66 can be airtightly linked via a main opening 22a of the housing portion 22.

The load port device 40 shown in FIG. 1 also functions as a wafer transport container interior cleaning device that cleans the interior of the FOUP 20 as a wafer transport container. The load port device 40 includes a front purge nozzle 41 and a bottom purge nozzle 42. The front purge nozzle 41 serves as a cleaning gas inlet where cleaning gas is introduced into the FOUP 20. The front purge nozzle 41 is arranged in the vicinity of the main opening 22a linked to the wafer transport chamber 66. The front purge nozzle 41 emits cleaning gas toward the main opening 22a of the FOUP 20 and introduces the cleaning gas into the FOUP 20. Incidentally, any gas, such as inactive gas of nitrogen gas or so and dry air, may be used as a cleaning gas for cleaning the interior of the FOUP 20, but nitrogen gas is preferably used.

The bottom purge nozzle 42 protrudes from the installation stand 46 and is linked to bottom openings 23a and 23b which are formed in a bottom portion 22b of the housing portion 22 of the FOUP 20. The bottom purge nozzle 42 includes an introduction nozzle 42a and a discharge nozzle 42b. The introduction nozzle 42a is linked to the bottom opening 23a provided at a position farther away from the main opening 22a than a central position of the bottom portion 22b. The discharge nozzle 42b is linked to the bottom opening 23b provided at a position closer to the main opening 22a than the central position of the bottom portion 22b. The introduction nozzle 42a can emit cleaning gas, and the cleaning gas emitted from the introduction nozzle 42a is introduced into the FOUP 20 via the bottom opening 23a. An atmosphere in the FOUP 20 can be efficiently cleaned by discharging gas in the FOUP 20 via the discharge nozzle 42b simultaneously with emission of cleaning gas from the introduction nozzle 42a.

Introduction of cleaning gas through the front purge nozzle 41 and the introduction nozzle 42a of the bottom purge nozzle 42 is controlled by a controller 43 of the load port device 40. The controller 43 controls introduction of cleaning gas into the FOUP 20 by, for example, opening and closing an electromagnetic valve provided in piping that supplies cleaning gas to the front purge nozzle 41 and the introduction nozzle 42a. The controller 43 may control introduction of cleaning gas into the FOUP 20 by adjusting the discharge amount from the discharge nozzle 42b of the bottom purge nozzle 42. Incidentally, gas in the FOUP 20 may be discharged through the discharge nozzle 42b by forced exhaust or natural exhaust.

The load port device 40 includes a receiver 44. The receiver 44 receives a first information, a second information, and the like from the measurement device 30 arranged in the FOUP 20. The first information includes a detection result of the atmosphere in the FOUP 20. The second information is transmitted when a voltage of an electricity storage unit 34 (see FIG. 4) in the measurement device 30 becomes a predetermined value or more. The receiver 44 includes a modem or so and can communicate with at least a transmitter 32 (see FIG. 4) of the measurement device 30 provided in the FOUP 20 being mounted on the installation stand 46. As mentioned below, the receiver 44 can transmit various types of signals including a control signal to the transmitter 32. The controller 43 can control the front purge nozzle 41 and the bottom purge nozzle 42 and clean the interior of the FOUP 20 based on a detection result included in the first information received by the receiver 44. The receiver 44 and a method for cleaning the interior of the FOUP 20 using information obtained via the receiver 44 is described below in detail.

The FOUP 20 mounted on the installation stand 46 of the load port device 40 in FIG. 1 is a transport container for transporting the wafer 10 in a semiconductor factory. The FOUP 20 has a box outer shape (generally rectangular parallelepiped), and a space for accommodating the wafer 10 inside is formed in the FOUP 20.

Figure 2:
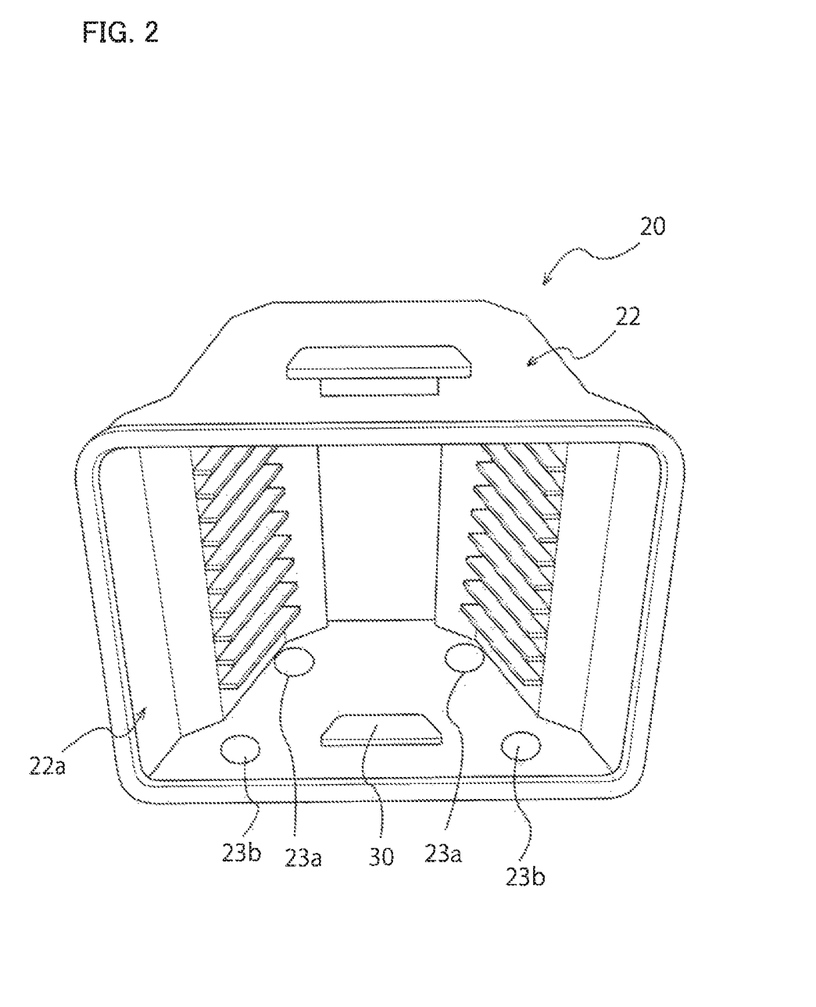
FIG. 2 is a perspective view showing the interior of a housing portion of the wafer transport container shown in FIG. 1.

The FOUP 20 includes the housing portion 22 and the lid 26 that is detachable from the housing portion 22. The housing portion 22 accommodates the wafer 10, and the main opening 22a for unloading the wafer 10 from the interior of the FOUP 20 and loading the wafer 10 into the FOUP 20 is formed in a side surface of the housing portion 22. As shown in FIG. 2, shelves for placing a plurality of horizontally held wafers 10 in the vertical direction are arranged in the housing portion 22. The wafers 10 mounted on the shelves are housed at fixed intervals in the FOUP 20.

As shown in FIG. 1, the lid 26 is provided detachably from the main opening 22a of the housing portion 22. The load port device 40 can open the main opening 22a of the FOUP 20 by engaging the door 47 with the lid 26 and moving the door 47 engaged with the lid 26 into the wafer transport chamber 66.

As shown in FIG. 1 and FIG. 2, four bottom openings 23a and 23b are formed in total in the bottom portion 22b of the housing portion 22 of the FOUP 20. The introduction nozzles 42a of the load port device 40 are linked to two bottom openings 23a provided at positions farther away from the main opening 22a than the central position of the bottom portion 22b, and cleaning gas is introduced into the FOUP 20 via the bottom openings 23a. The discharge nozzles 42b of the load port device 40 are linked to two bottom openings 23b provided at positions closer to the main opening 22a than the central position of the bottom portion 22b, and gas is discharged from the FOUP 20 via the bottom openings 23b.

As shown in FIG. 1, the measurement device 30, which detects the atmosphere in the FOUP 20 and communicates the atmosphere, is provided on the bottom portion 22b of the housing portion 22 of the FOUP 20. As shown in FIG. 2, the measurement device 30 (a detector 31 (see FIG. 4) in the measurement device 30 in particular) is provided in the vicinity of the two bottom openings 23b provided at the positions closer to the main opening 22a, but the measurement device 30 is arranged at any position.

Figure 3:
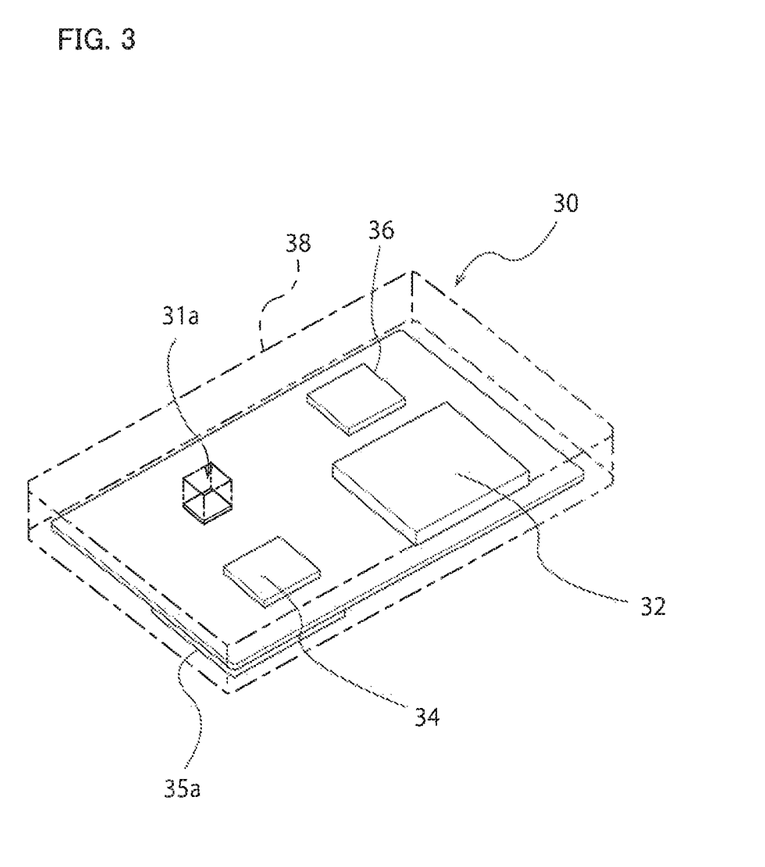
FIG. 3 is a schematic perspective view of a wafer transport container interior atmosphere measurement device according to the embodiment of the present invention.

As shown in FIG. 3, the measurement device 30 has a generally rectangular parallelepiped outer shape whose surface is mostly covered with a cover portion 38, such as a resin. The measurement device 30 has a cartridge shape where the detector 31, the transmitter 32, a power source 33, a communication controller 36 (see FIG. 4), and the cover portion 38 mentioned below are integrated, and is detachable from the FOUP 20. Since the measurement device 30 has a detachable cartridge shape, the measurement device 30 can be removed at the time of, e.g., cleaning of the FOUP 20, and the measurement device 30 can be attached to another FOUP 20 and used as needed. Incidentally, the measurement device 30 are not limited to having the above-mentioned shape and structure, and may be installed undetachably from the FOUP 20.

Figure 4:
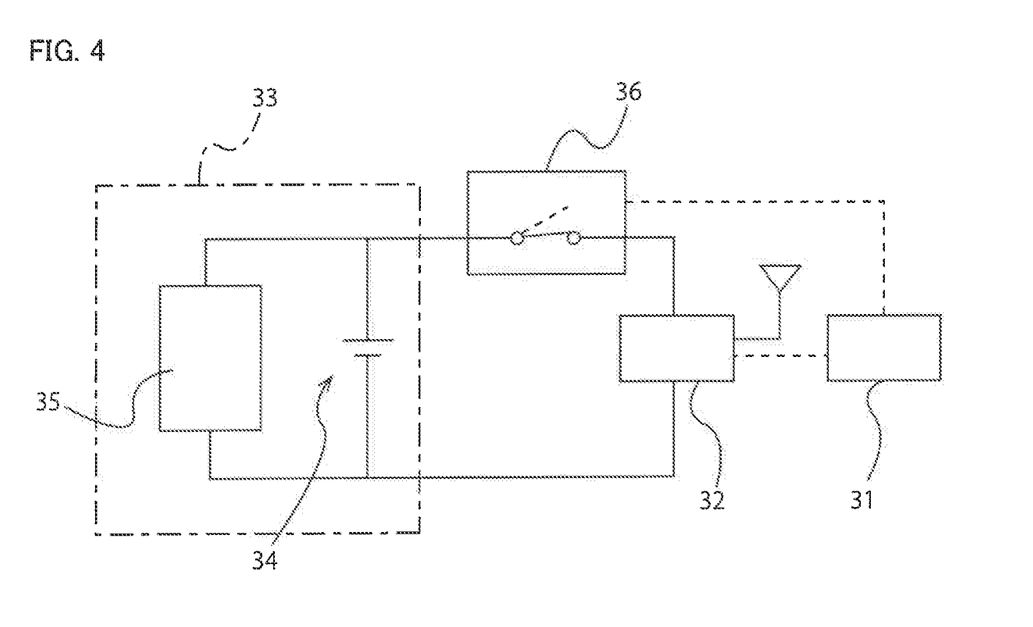
FIG. 4 is a conceptual diagram showing a schematic circuit configuration of the wafer transport container interior atmosphere measurement device shown in FIG. 3.

FIG. 4 is a conceptual diagram showing a schematic circuit configuration of the measurement device 30. The measurement device 30 includes the detector 31, the transmitter 32, the power source 33, and the communication controller 36. The detector 31 detects the atmosphere in the FOUP 20. The transmitter 32 wirelessly transmits a first information including a detection result by the detector 31 to the receiver 44 of the load port device 40. The power source 33 supplies power to the detector 31 and the transmitter 32. The communication controller 36 controls the constituent parts of the measurement device 30.

The detector 31 shown in FIG. 4 includes a sensor that detects the atmosphere in the FOUP 20, such as components of gas in the FOUP 20 and the cleanliness of the gas (the amount of particles included in the gas). Any sensor that detects cleanliness, such as an oxygen concentration meter, a water (vapor) concentration meter, a nitrogen concentration meter, a differential pressure gauge, and a particle counter, may be included in the detector 31. As shown in FIG. 3, the detector 31 includes a sensing portion 31a. The sensing portion 31a is exposed from the cover portion 38 and is in contact with the atmosphere in the FOUP 20. The detector 31 detects the cleanliness of gas via the sensing portion 31a.

The transmitter 32 shown in FIG. 4 wirelessly transmits the first information including a detection result of the atmosphere in the FOUP 20, the second information transmitted when a voltage of the electricity storage unit 34 in the measurement device 30 becomes a predetermined value or more, and the like to the receiver 44 of the load port device 40. The transmitter 32 can receive a control signal about the measurement device 30 from the receiver 44. Although the transmitter 32 is composed of a modem, an antenna, and the like, but a specific configuration of the transmitter 32 is not particularly limited.

As shown in FIG. 4, the power source 33 includes the rechargeable electricity storage unit 34 and a power receiving unit 35. The power receiving unit 35 receives energy supply from the outside and charges the electricity storage unit 34. Examples of the electricity storage unit 34 include, but not particularly limited to, an electric double layer capacitor (EDLC) and a lithium ion secondary battery. Examples of the power receiving unit 35 include a power generating element that converts energy other than electromagnetic energy into electrical energy and generates power and a power receiving element that receives electromagnetic energy from the outside. Examples of the power generating element include a solar battery and a vibration power generating element. Examples of the power receiving element include a non-contact charging power receiving coil.

The power receiving unit 35 according to the present embodiment includes a non-contact charging power receiving coil 35a as shown in FIG. 3, and can receive power supply based on electromagnetic induction from a power feed unit 45 provided on a surface of the installation stand 46 in the load port device 40. Power received or generated by the power receiving unit 35 is stored in the electricity storage unit 34 and is used by the transmitter 32 to transmit and receive information and by the detector 31 to detect the atmosphere in the FOUP 20.

The communication controller 36 shown in FIG. 4 controls power supply from the power source 33 to the transmitter 32. For example, the communication controller 36 can cut off power supply from the power source 33 to the transmitter 32 in a non-communication period where the transmitter 32 does not communicate information. It is thus possible to reduce power consumed to keep the transmitter 32 in a standby state (sleep state) and effectively use power from the power source 33.

The communication controller 36 can control the transmitter 32 to wirelessly transmit the second information different from the first information on a detection result of the atmosphere to the receiver 44 of the load port device 40 when a voltage of the electricity storage unit 34 becomes a predetermined value or more. With this configuration, even if a voltage of the electricity storage unit 34 in the measurement device 30 becomes less than a predetermined value while the measurement device 30 is transported together with the FOUP 20, the measurement device 30 can operate when the voltage of the electricity storage unit 34 recovers to a predetermined value or more by charging the electricity storage unit 34 via the power receiving unit 35. That is, if a voltage of the electricity storage unit 34 recovers to a predetermined value or more, the load port device 40 can recognize that the measurement device 30 of interest is in a state capable of communication and detection operation based on reception of the second information composed of an acknowledgment request signal or so by the receiver 44 of the load port device 40. Thus, even if the transmitter 32 of the measurement device 30 is not always maintained in the standby state capable of signal transmission and reception, the load port device 40 can operate the measurement device 30 and obtain a detection result of the atmosphere in the FOUP 20 by transmitting a control signal to the measurement device 30 via the receiver 44 after reception of the second information.

Incidentally, the communication controller 36 controls not only power supply from the power source 33 to the transmitter 32 but also power supply from the power source 33 to the detector 31 and the operation of the transmitter 2 and the detector 31. For example, the communication controller 36 is composed of a microcontroller (MCU), but is composed of any configuration.

As shown in FIG. 3, the measurement device 30 includes the cover portion 38. The cover portion 38 covers the detector 31 excluding the sensing portion 31a in contact with the atmosphere in the FOUP 20, the transmitter 32, and the power source 33 so as to avoid contact with the atmosphere in the FOUP 20. The measurement device 30 including the cover portion 38 can protect circuits, electronic parts, and the like constituting the detector 31, the transmitter 32, and the power source 33 from outgas or so from the wafer 10, and has preferable reliability.

Figure 5:
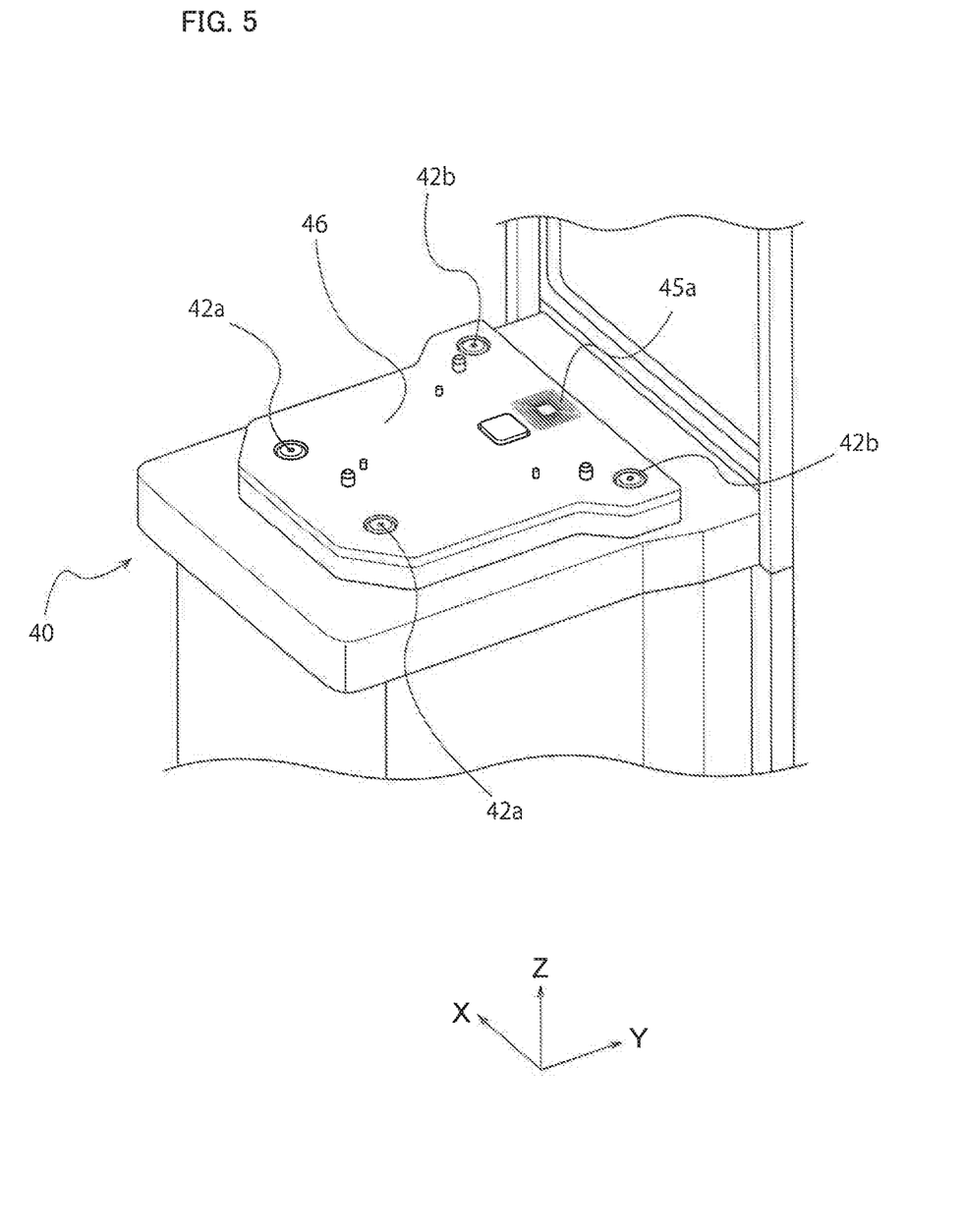
FIG. 5 is a schematic perspective view showing a vicinity of an installation stand of the wafer transport container interior cleaning device shown in FIG. 1.
Figure 6:
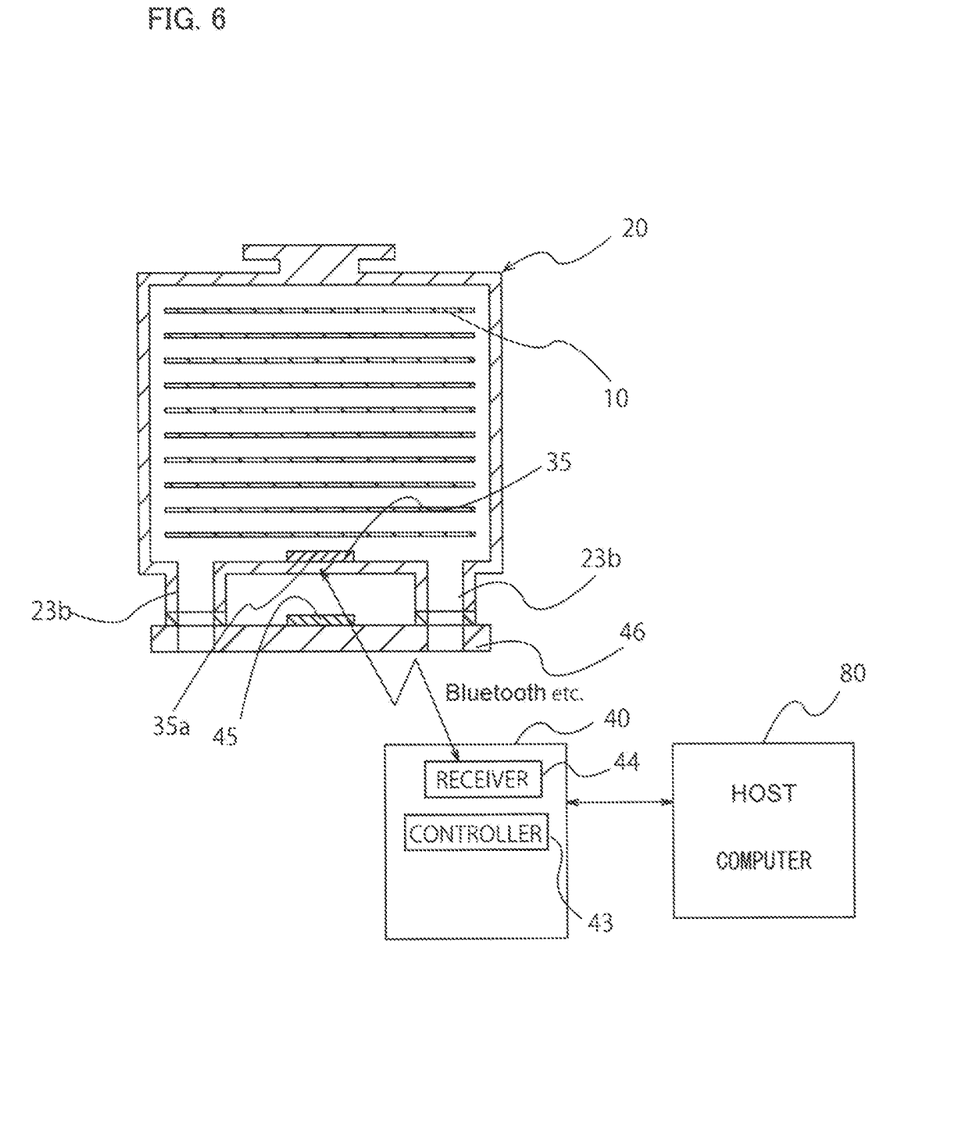
FIG. 6 is a conceptual view for explaining communication between the wafer transport container interior atmosphere measurement device and the wafer transport container interior cleaning device shown in FIG. 1.

FIG. 5 is a schematic perspective view showing a vicinity of the installation stand 46 of the load port device 40. FIG. 6 is a conceptual view for explaining a communication state between the measurement device 30 and the load port device 40. As shown in FIG. 5 and FIG. 6, the load port device 40 includes the power feed unit 45 arranged on an upper surface of the installation stand 46. As shown in FIG. 5, the power feed unit 45 includes a non-contact charging power feeding coil 45a. The power feeding coil 45a is arranged to face the power receiving coil 35a (see FIG. 3) of the measurement device 30 while the FOUP 20 is mounted on the installation stand 46. The power feeding coil 45a can supply power to the power receiving coil 35a by electromagnetic induction.

As shown in FIG. 6, the receiver 44 of the load port device 40 wirelessly communicates the first information on a detection result of the atmosphere in the FOUP 20, the second information associated with the voltage of the electricity storage unit 34, any other control information, and the like with the transmitter 32 provided in the measurement device 30 of the FOUP 20. The radio frequency used for communication between the receiver 44 and the transmitter 32 is not limited, and may be in the 2.4 GHz band that is used by Wi-Fi and Bluetooth® or in a sub-GHz band (the 920 MHz band) longer in communication range than the 2.4 GHz band.

As shown in FIG. 6, the receiver 44 of the load port device 40 receives the first information on a detection result of the atmosphere in the FOUP 20 from the measurement device 30 arranged in the FOUP 20, and the controller 43 of the load port device 40 controls a cleaning gas inlet like the front purge nozzle 41 and the bottom purge nozzle 42 shown in FIG. 1 based on the detection result. This allows efficient and appropriate cleaning of the interior of the FOUP 20. The detection result of the atmosphere in the FOUP 20 measured by the measurement device 30 may be sent to a HOST computer 80 in the factory directly or via the receiver 44. The HOST computer 80 may calculate a requirement for cleanliness in the FOUP 20 by calculating the correlation between a parameter associated with the quality of the wafer 10 and the detection result of the atmosphere in the FOUP 20 and use the requirement as a threshold used at the time of starting or ending cleaning processing on the FOUP 20.

Figure 11:
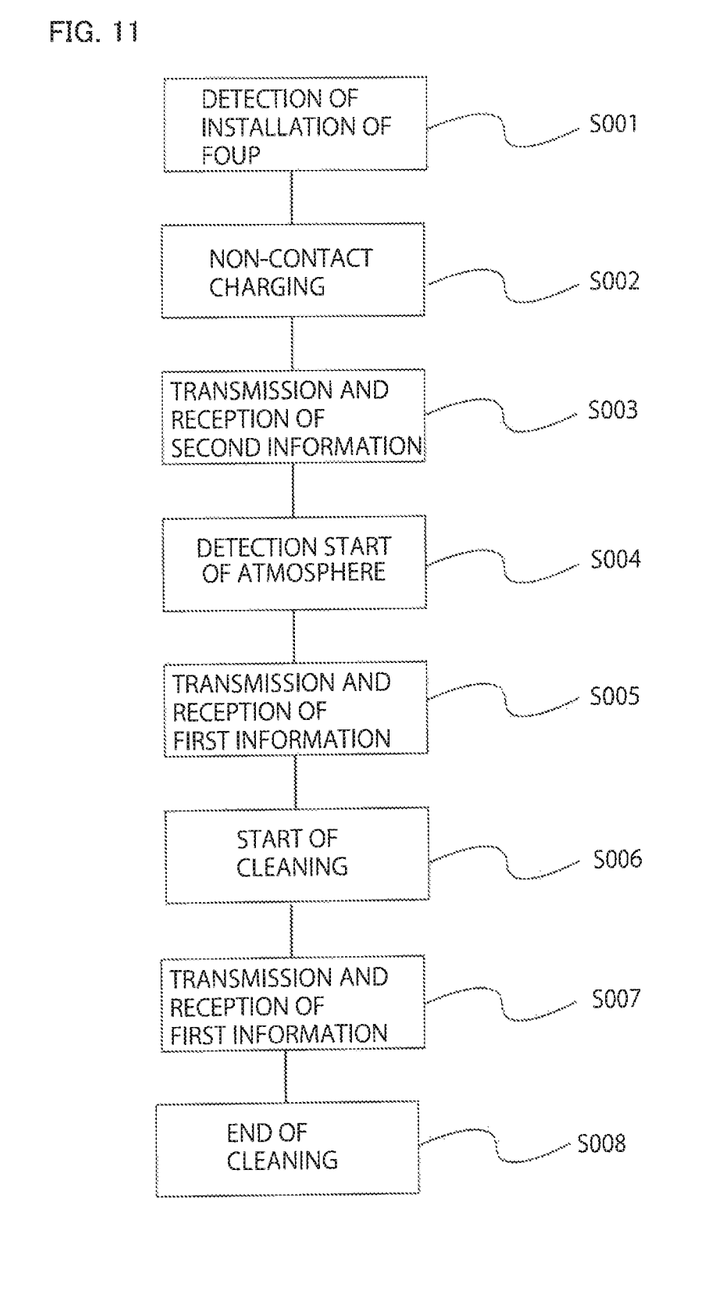
FIG. 11 is a flowchart representing a wafer transport container interior cleaning process according to the embodiment of the present invention.

FIG. 11 is a flowchart representing a FOUP 20 interior cleaning process to be performed in the load port device 40 and the FOUP 20 provided with the measurement device 30 shown in FIG. 1. In step S001 shown in FIG. 11, the controller 43 of the load port device 40 detects that the FOUP 20 has been correctly mounted on the installation stand 46. In step S002 shown in FIG. 11, the controller 43 of the load port device 40 drives the power feed unit 45 provided on the upper surface of the installation stand 46 and feeds power to the power receiving unit 35 (see FIG. 4) of the measurement device 30 provided in the FOUP 20. With the power feeding, the electricity storage unit 34 (see FIG. 4) in the measurement device 30 is charged, and the voltage of the electricity storage unit 34 rises.

In step S003 shown in FIG. 11, the communication controller 36 of the measurement device 30 provided in the FOUP 20 controls the transmitter 32 and transmits the second information sent when a voltage of the electricity storage unit 34 recovers to a predetermined value or more to the receiver 44 of the load port device 40. When the receiver 44 of the load port device 40 receives the second information, the controller 43 of the load port device 40 recognizes that the measurement device 30 is in an operable state.

In step S004 shown in FIG. 11, the measurement device 30 starts detection of the atmosphere in the FOUP 20. More specifically, the load port device 40 after reception of the second information indicating that the measurement device 30 is in the operable state transmits a control signal instructing the measurement device 30 to start an operation of detecting the atmosphere in the FOUP 20 to the transmitter 32 of the measurement device 30 via the receiver 44. The measurement device 30 after reception of the control signal via the transmitter 32 brings the detector 31 into operation and detects the atmosphere in the FOUP 20. In addition, the transmitter 32 of the measurement device 30 wirelessly transmits the first information including a detection result by the detector 31 to the receiver 44 of the load port device 40.

In step S005 shown in FIG. 11, the receiver 44 of the load port device 40 receives the first information transmitted by the transmitter 32 of the measurement device 30. In step S006 shown in FIG. 11, the controller 43 of the load port device 40 controls the front purge nozzle 41 and the bottom purge nozzle 42 and starts cleaning of the interior of the FOUP 20. In this case, the controller 43 of the load port device 40 may change cleaning operation on the FOUP 20 based on the detection result included in the first information received by the receiver 44. For example, if the controller 43 of the load port device 40 recognizes from the first information that the cleanliness of the FOUP 20 is not less than a predetermined value or more, the controller 43 may end the series of processes shown in FIG. 11 without performing the cleaning operation.

Figure 7:
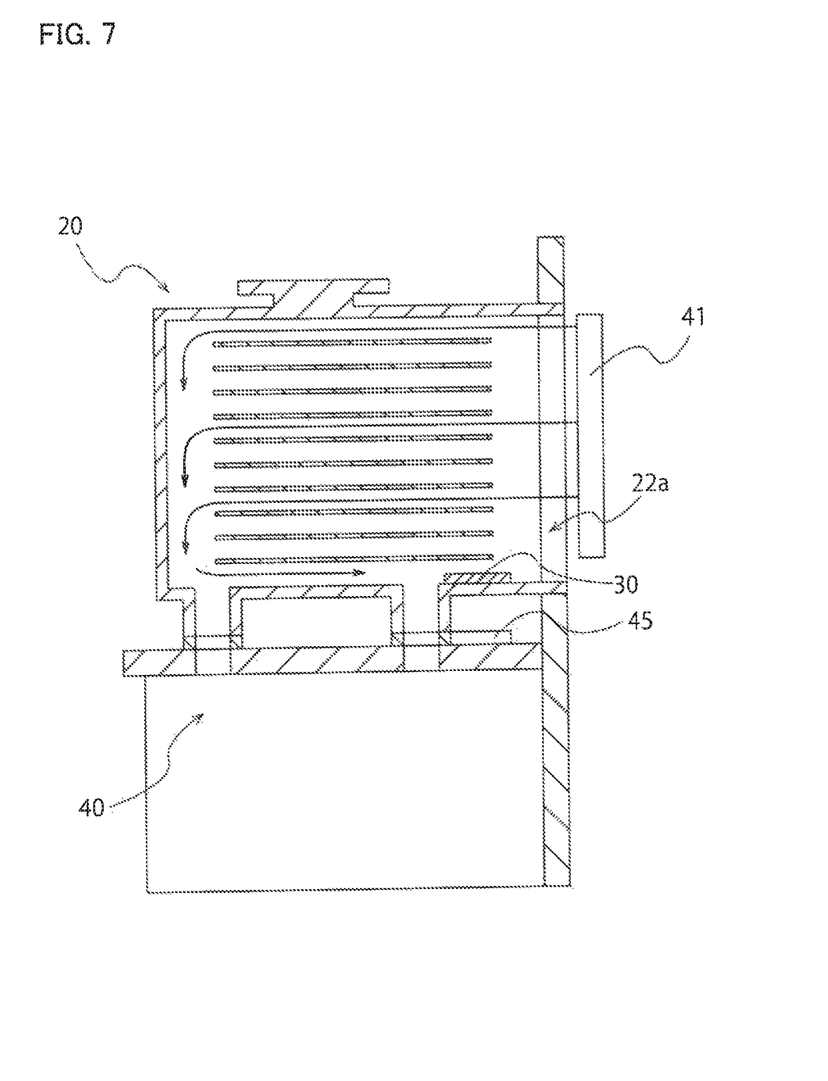
FIG. 7 is a conceptual view showing a state during a wafer transport container interior cleaning process of cleaning the interior of the wafer transport container shown in FIG. 1.

If the controller 43 recognizes from the first information that the cleanliness of the FOUP 20 is less than a predetermined value, the controller 43 of the load port device 40 introduces cleaning gas into the FOUP 20 using the front purge nozzle 41 and starts cleaning processing on the interior of the FOUP 20 as shown in FIG. 7. Incidentally, a process of opening the lid 26 of the FOUP 20 and causing the interior of the FOUP 20 to communicate with the wafer transport chamber 66 by the load port device 40 may be performed in parallel between step S002 and step S005 in FIG. 11, or may be performed after a decision is made in step S006 to perform cleaning operation.

Even while cleaning gas is introduced into the FOUP 20 via the front purge nozzle 41 as shown in FIG. 7, the measurement device 30 detects the cleanliness of the FOUP 20 automatically or based on a control signal from the load port device 40 and transmits the first information including a detection result of the load port device 40. At this time, the controller 43 of the load port device 40 can bring the power feed unit 45 into operation and supply power to the measurement device 30 as needed.

As Shown in FIG. 7, while the cleaning operation on the FOUP 20 by the front purge nozzle 41 is performed, cleaning gas is introduced from central and upper regions in the main opening 22a into the FOUP 20, and an airflow discharged from a lower portion of the main opening 22a is formed. Since the measurement device 30 is arranged at the lower portion of the main opening 22a, where gas is discharged, cleaning gas is prevented from being emitted directly to the measurement device 30, and the problem of discrepancy between a detection value from the detector 31 of the measurement device 30 and an actual atmosphere in the FOUP 20 can be prevented.

In step S007 shown in FIG. 11, the receiver 44 of the load port device 40 receives the first information including a detection result of the cleanliness in the FOUP 20 during the cleaning operation. The controller 43 of the load port device 40 judges whether to continue or end the cleaning operation on the FOUP 20 based on the detection result included in the first information received by the receiver 44.

That is, if the controller 43 of the load port device 40 recognizes that the cleanliness of the FOUP 20 is less than a predetermined value based on the detection result included in the first information received in step S007, the controller 43 continues the cleaning operation shown in FIG. 7. On the other hand, if the controller 43 of the load port device 40 recognizes that the cleanliness of the FOUP 20 is a predetermined value or more based on the detection result included in the first information received in step S007, the flow advances to step S008, and the series of operations are ended.

As described above, since the load port device 40 can recognize a detection result of the atmosphere in the FOUP 20 in the cleaning process as shown in FIG. 11, an appropriate and efficient cleaning processing can be performed on the FOUP 20. In addition, since the measurement device 30 provided in the FOUP 20 detects the atmosphere, the atmosphere in the FOUP 20 can be easily and accurately recognized without leading gas in the FOUP 20 outside. In addition, since a detection result by the measurement device 30 is transmitted to the load port device 40 through wireless communication, an electrical contact or the like for data transmission need not be provided on a surface of the FOUP 20, and installation of the measurement device 30 in the FOUP 20 little impairs the airtightness and durability of the FOUP 20.

The measurement device 30 includes the non-contact charging power receiving coil 35a, which charges the electricity storage unit 34, and the electricity storage unit 34 of the measurement device 30 can be charged via the power feed unit 45 (the power feeding coil 45a) provided on the installation stand 46 of the load port device 40. Thus, the measurement device 30 with the above-mentioned configuration can save much trouble in battery life management and reduce battery management and replacement costs.

The present invention is described above with reference to the embodiment, but is not limited to the embodiment, and needless to say, includes many other embodiments, modifications, and the like. For example, a wafer transport container for transporting the wafer 10 is not limited to the FOUP 20, and the measurement device 30 may be provided in a different container, such as a FOUP for transporting the wafer 10. For example, a wafer transport container interior cleaning device that is provided with the receiver 44 as shown in FIG. 6 and cleans the interior of the FOUP 20 using the first information from the measurement device 30 is not limited to the load port device 40 shown in the embodiment, and may be a special purpose machine for cleaning the interior of the FOUP 20 (a so-called standalone wafer transport container interior cleaning device), or a stocker for the FOUP 20, or the like. The measurement device 30 may detect not only the atmosphere of the FOUP 20 installed in a wafer transport container interior cleaning device but also the atmosphere of the FOUP 20 in a location other than a wafer transport container interior cleaning device, such as a buffer station. In this case, the first information including a detection result is sent from the transmitter 32 as a slave unit to the load port device 40 including the receiver 44 as a master unit or the HOST computer 80. For example, in the cleaning process in the load port device 40, cleaning processing using the bottom purge nozzles 42a and 42b as shown in FIG. 8 can be performed instead of cleaning processing using the front purge nozzle 41 as shown in FIG. 7.

Figure 8:
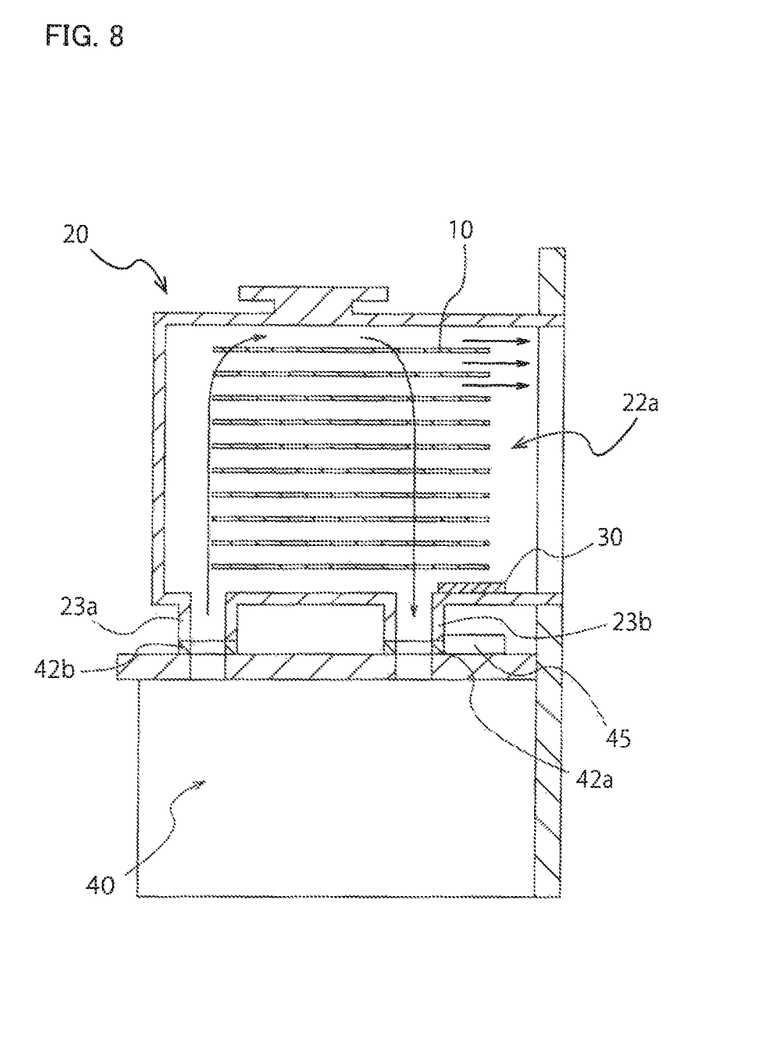
FIG. 8 is a conceptual view showing another state during the wafer transport container interior cleaning process of cleaning the interior of the wafer transport container shown in FIG. 1.

In the cleaning processing using the introduction nozzles 42a and the discharge nozzles 42b as shown in FIG. 8, cleaning gas is introduced into the FOUP 20 through the bottom openings 23a, and gas in the FOUP 20 is discharged through the bottom openings 23b. Since the detector 31 of the measurement device 30 is provided in the vicinity of the bottom openings 23b, where the discharge nozzle 42b is connected, that is, since the detector 31 of the measurement device 30 is provided in a region of the bottom portion 22b closer to the main opening 22a than the central position in the FOUP 20, the measurement device 30 can accurately detect the atmosphere in the FOUP 20.

Figure 9:
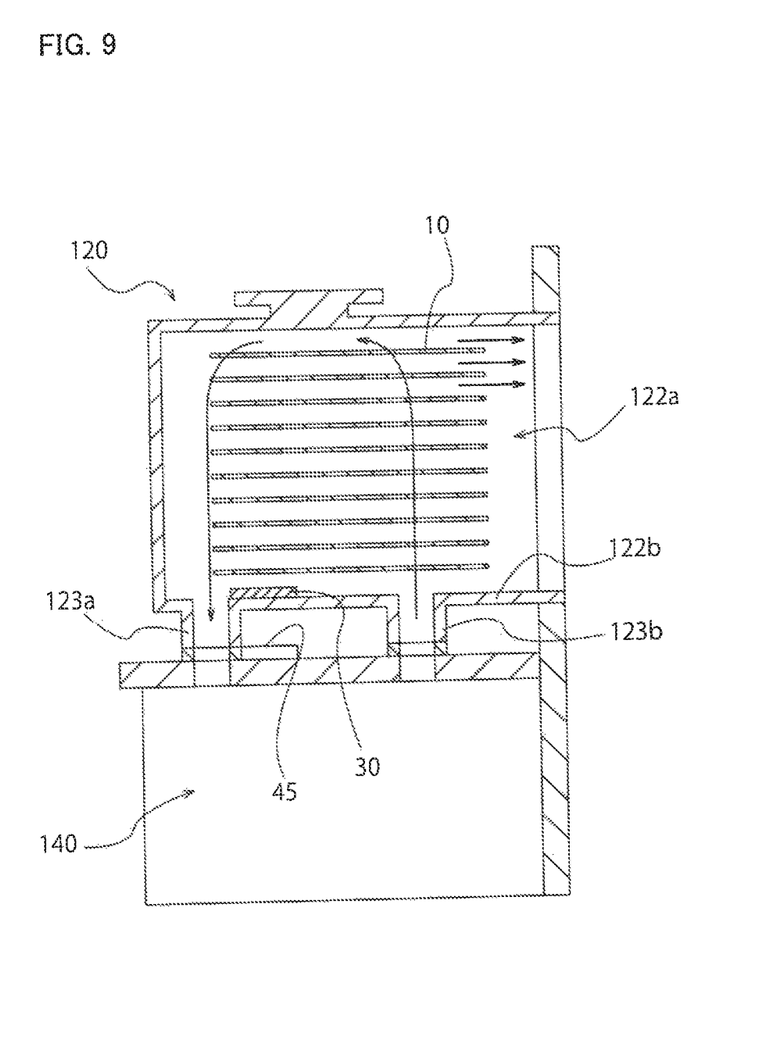
FIG. 9 is a conceptual view showing a state during a wafer transport container interior cleaning process of cleaning the interior of a wafer transport container according to a first modification.

FIG. 9 is a conceptual view representing an example of cleaning processing to be performed using a FOUP 120 and a load port device 140 according to a first modification. The example shown in FIG. 9 is different from the example shown in FIG. 8 in that a discharge nozzle that discharges gas in the FOUP 120 is connected to bottom openings 123a provided at positions farther away from a main opening 122a than a central position of a bottom portion 122b. In the example shown in FIG. 9, an introduction nozzle that introduces cleaning gas into the FOUP 120 is connected to bottom openings 123b provided at positions closer to the main opening 122a than the central position of the bottom portion 122b.

Since the detector 31 of the measurement device 30 is provided in the vicinity of the bottom openings 123a, where the discharge nozzle is connected, that is, since the detector 31 of the measurement device 30 is provided in a region of the bottom portion 122b farther away from the main opening 122a than the central position in the FOUP 120, the measurement device 30 can accurately detect an atmosphere in the FOUP 120.

Figure 10:
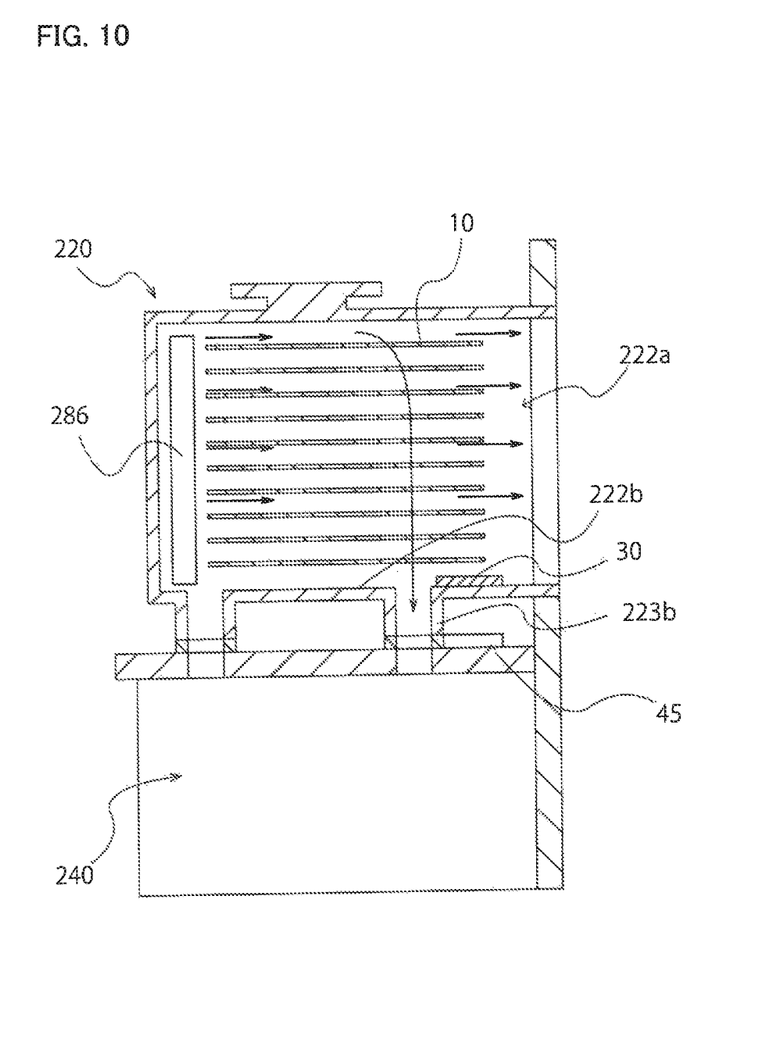
FIG. 10 is a conceptual view showing a state during a wafer transport container interior cleaning process of cleaning the interior of a wafer transport container according to a second modification.

FIG. 10 is a conceptual view representing an example of cleaning processing to be performed using a FOUP 220 and a load port device 240 according to a second modification. In the example shown in FIG. 10, cleaning gas is introduced into the FOUP 220 via an introduction nozzle 286 provided in the FOUP 220, and gas in the FOUP 220 is discharged via a main opening 222a and bottom openings 223b close to the main opening 222a. In the example shown in FIG. 10, the measurement device 30 is preferably arranged in the vicinity of the main opening 222a or the bottom openings 223b, more preferably in a bottom portion 222b between the main opening 222a and the bottom openings 223b.

In each of the measurement devices 30 illustrated in the embodiment and the modifications described above, the detector 31, the transmitter 32, the power source 33, the communication controller 36, and the cover portion 38 are integrated as shown in FIG. 3, but a measurement device is not limited thereto. In another embodiment, the detector 31 and the power source 33 may be arranged at separate locations in the FOUP 20. For example, the detector 31 may be arranged on a ceiling surface of the FOUP 20, and the power source 33 may be arranged on the bottom portion 22b. Incidentally, the power receiving coil 35a shown in FIG. 3 is preferably provided on the bottom portion 22b of the FOUR 20, and the power feeding coil 45a shown in FIG. 5 is preferably provided on the installation stand 46. This makes it possible to reduce a distance between the power receiving coil 35a and the power feeding coil 45a, and the power efficiency at the time of charging can be thereby enhanced.

NUMERICAL REFERENCES

10 . . . wafer
20 . . . FOUP
22 . . . housing portion
22a . . . main opening
22b . . . bottom portion
23a, 23b . . . bottom opening
26 . . . lid
30 . . . wafer transport container interior atmosphere measurement device (measurement device)
31 . . . detector
31a . . . sensing portion
32 . . . transmitter
33 . . . power source
34 . . . electricity storage unit
35 . . . power receiving unit
35a . . . power receiving coil
36 . . . communication controller
38 . . . cover portion
40 . . . load port device
41 . . . front purge nozzle
42 . . . bottom purge nozzle
42a . . . introduction nozzle
42b . . . discharge nozzle
43 . . . controller
44 . . . receiver
45 . . . power feed unit
45a . . . power feeding coil
46 . . . installation stand
47 . . . door
60 . . . EFEM
62 . . . transport robot
64 . . . wall portion
80 . . . HOST computer

What is claimed is:

1. A wafer transport container interior atmosphere measurement device arranged in a wafer transport container and configured to detect an atmosphere in the wafer transport container and communicate the atmosphere, the device comprising:
    a detector configured to detect the atmosphere in the wafer transport container;
    a transmitter configured to wirelessly transmit a first information including a detection result by the detector to an external receiver; and
    a power source configured to supply electric power to the detector and the transmitter, wherein the power source comprises:
    a rechargeable electricity storage unit; and
    a power receiving unit that has a non-contact charging power receiving coil which is configured to (1) receive energy supplied from an outside power supply through a wall of the container without being directly connected to the power supply and without opening the container and (2) charge the electricity storage unit,
    wherein the non-contact charging power receiving coil of the power receiving unit is provided on a bottom portion of the wafer transport container.

2. The wafer transport container interior atmosphere measurement device according to claim 1, wherein the transmitter is configured to wirelessly transmit a second information different from the first information to the receiver when a voltage of the electricity storage unit becomes a predetermined value or more.

3. The wafer transport container interior atmosphere measurement device according to claim 1, further comprising a cover portion configured to cover the detector excluding a sensing portion in contact with the atmosphere in the wafer transport container, the transmitter, and the power source so as to avoid contact with the atmosphere.

4. The wafer transport container interior atmosphere measurement device according to claim 2, further comprising a cover portion configured to cover the detector excluding a sensing portion in contact with the atmosphere in the wafer transport container, the transmitter, and the power source so as to avoid contact with the atmosphere.

5. A wafer transport container comprising: the wafer transport container interior atmosphere measurement device according to claim 1;
    a housing portion accommodating a wafer and provided with a main opening for unloading and loading the wafer; and
    a lid detachably provided at the main opening,
    wherein a bottom opening capable of discharging gas from the wafer transport container is formed at a bottom portion of the housing portion, and
    the detector of the wafer transport container interior atmosphere measurement device is provided in a vicinity of the bottom opening.

6. A wafer transport container comprising: the wafer transport container interior atmosphere measurement device according to claim 2;
    a housing portion accommodating a wafer and provided with a main opening for unloading and loading the wafer; and
    a lid detachably provided at the main opening,
    wherein a bottom opening capable of discharging gas from the wafer transport container is formed at a bottom portion of the housing portion, and
    the detector of the wafer transport container interior atmosphere measurement device is provided in a vicinity of the bottom opening.

7. The wafer transport container interior atmosphere measurement device according to claim 1, wherein the detector is located at a wall of the wafer transport container that includes an inlet for cleaning gas.

* * * * *